United States Patent [19]

Meyer

[11] 4,140,925
[45] Feb. 20, 1979

[54] AUTOMATIC D-C OFFSET CANCELLATION IN PCM ENCODERS

[75] Inventor: Fred Meyer, Wakefield, Canada

[73] Assignee: Northern Telecom Limited, Montreal, Canada

[21] Appl. No.: 815,795

[22] Filed: Jul. 15, 1977

[51] Int. Cl.² .................... H03K 17/16; H03K 17/66
[52] U.S. Cl. ......................... 307/246; 340/347 CC; 328/151; 307/353; 328/162; 179/15 BL
[58] Field of Search ............... 328/150, 168, 172, 151, 328/162; 179/15 BL; 340/347 CC; 307/246, 353

[56] References Cited
U.S. PATENT DOCUMENTS

| 3,103,629 | 9/1963 | Damen et al. | 340/347 CC |
|---|---|---|---|
| 3,207,986 | 9/1965 | Bailey | 340/347 CC |
| 3,654,560 | 4/1972 | Cath et al. | 340/347 CC |
| 3,816,825 | 6/1974 | Kaneko et al. | 340/347 CC |
| 3,819,864 | 6/1974 | Carroll et al. | 179/15 BL |

Primary Examiner—John S. Heyman
Attorney, Agent, or Firm—Achmed N. Sadik

[57] ABSTRACT

During encoding of voice frequency (VF) signal in a PCM channel bank the encoder encounters direct current (d-c) offset component resulting from the particular VF signal. Such d-c offsets cause errors above and beyond the normal errors inherent in the normal encoding process. The present invention alleviates this problem by providing an automatic d-c offset cancellation circuit which closely follows the d-c offset component and provides a d-c component of opposite sign to cancel it.

1 Claim, 1 Drawing Figure

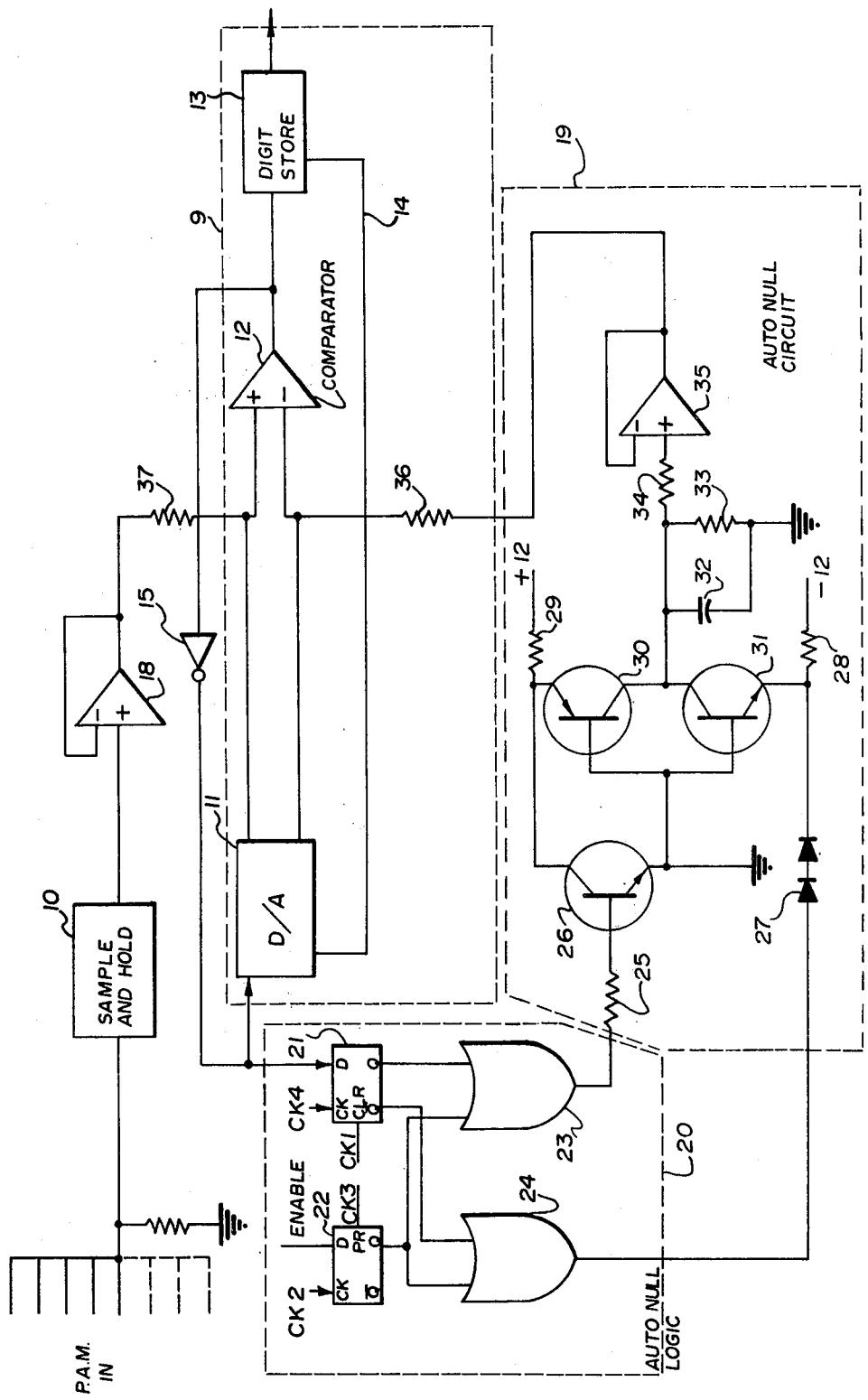

AUTOMATIC D-C OFFSET CANCELLATION IN PCM ENCODERS

FIELD OF THE INVENTION

The present invention relates to pulse code modulation (PCM) encoders in general and particularly to multichannel encoders suitable for channel banks.

BACKGROUND OF THE INVENTION

It is one of the functions of a PCM channel bank to receive voice frequency (VF) signals from a plurality of VF lines and deliver them encoded and multiplexed in a digital time division multiplexed format. The standard for North America is the 24-channel T1 format.

When encoding each of the VF signals, the encoder encounters a direct current (d-c) offset component resulting from the particular VF signal. Such d-c offset component causes an error above and beyond the normal encoding errors inherent in the encoding process. Methods of counteracting this d-c offset component have included inserting a fixed counter-offset component. However, since the d-c offset component itself varies with time as well as from one VF signal to another, such method of compensation is not fully satisfactory.

SUMMARY OF THE INVENTION

The present invention endeavours to alleviate this problem by providing an automatic d-c offset cancellation circuit which follows the d-c offset component reasonably closely and provides a d-c component of opposite sign to cancel it.

According to the present invention an automatic d-c offset cancellation circuit for a pulse code modulation (PCM) encoder is provided comprising charge storage means providing a d-c counter-offset component to said PCM encoder, charging means for charging said charge storage means with one of a positive and negative d-c currents and logic means responsive to the output of said PCM encoder for controlling said charging means to supply a negative current to said charge storage means upon occurrence of a positive transition at the output of said PCM encoder and vice versa.

BRIEF DESCRIPTION OF THE DRAWINGS

A preferred embodiment will now be described in conjunction with the accompanying drawing which is a schematic of the automatic d-c offset cancellation circuit in accordance with the present invention.

DESCRIPTION OF THE PREFERRED EMBODIMENT

Referring to the drawing it is seen that the pulse amplitude modulated samples from the channel units are resampled and stored in the sample and hold circuit 10, and are then converted to digital signals by an analog to digital coverter 9 (A/D). The A/D 9 is a successive approximation encoder made up of a digital to analog converter 11 (D/A), comparator 12 and digit store circuit 13.

In operation, the contents of the digit store 13 and hence the output of the D/A 11, due to feedback loop 14, is adjusted until it is the same as the output of the buffer 18 following the sample and hold 10. The output of the comparator 12 tells the digit store 13 whether the stored code is high or low. At the decision time, the digit stored code is adjusted so as to drive the comparator 12 via the feedback loop 14 and the D/A 11 high if the stored code is low and low if the stored code is high.

It is at the output of the comparator that the d-c offsets occur. These offsets are sensed by the autonull logic 20 which controls the autonull circuit 19 and automatically corrects for the d-c offsets. The autonull logic is comprised of two flip-flops 21 and 22 that drive two OR gates 23 and 24. The input of flip-flop 21 is connected to the output of comparator 12 through an inverter 15. The input of flip-flop 22 accepts the enable signal. Clock signals CK1 and CK4 are accepted respectively by the clear CLR and the clock CK terminals of flip-flop 21. Clock signals CK2 and CK3 are accepted respectively by the clock CK and preset PR terminals of flip-flop 22. The Q output terminal of flip-flop 21 is connected to one of the input terminals on OR gate 23 and the $\bar{Q}$ terminal is connected to one input terminal of OR gate 24. The Q output terminal of flip-flop 22 is connected to the other input terminals of both OR gates 23 and 24. The output signal of OR gate 23 drives through resistor 25 the base of an npn transistor 26. The output terminal of OR gate 24 is connected to the anode terminal of series diode pair 27 and the cathode terminal of the diode pair 27 is connected to the first terminal of a resistor 28 with the second terminal connected to $-12V$. The collector of transistor 26 is connected to the first terminal of resistor 29 the second terminal of which is connected to $+12V$. The emitter of transistor 26 is grounded. The emitter of pnp transistor 30 is connected to the said first terminal of resistor 29. The collector of transistor 30 is connected to the collector of npn transistor 31 with the emitter of transistor 31 connected to the said first terminal of resistor 28. The bases of both transistors 30 and 31 are grounded.

The collectors of transistors 30 and 31 are connected to a first terminal of capacitor 32 and the first terminal of resistor 33. The said collectors are also connected through resistor 34 to buffer 35. The other terminals of said devices 32 and 33 are grounded. The output terminal of buffer 35 is connected through resistor 36 to the inverting input terminal comparator 12.

In operation the autonull logic 20 receives six signals. The first is the inverted d-c error signal from comparator 12. The second is the external enable pulse and the other 4, CK1, CK2, CK3, CK4, are external clock pulses.

The enabling pulse is such that where it is low, i.e. there is a signal on at least one PAM channel, operating the autonull logic is enabled; if the enable pulse is high, i.e. there are no channels operating, the autonull logic 20 and hence the autonull circuit 19 are disabled because no d-c offsets occur with no channels operating. The external clock pulses CK1, CK2, CK3 and CK4 are timing pulses which provide synchronization between the channel unit timing and the timing for the autonull logic.

A negative offset results in a high signal from OR gate 23 turning transistor 26 "ON" and turning transistor 30 "OFF". Transistor 31 is turned on by the low signal from OR gate 24. Current flows from ground through resistor 33 and capacitor 32 to $-12V$ through transistor 31 and resistor 28, and a negative charge builds on the capacitor 32. The negative signal, buffered by buffer 35 a unity gain device, is sent to the inverting input of comparator 12 where it nulls the original d-c offset. If the original d-c offset is positive the output signals from OR gates 23 and 24 are reversed. The low signal from OR gate 23 turns transistor 26 off. The high signal from OR gate 24 turns transistor 31 off as well. Transistor 30 is turned on and current flows from +12V through resistor 29 and transistor 30 to ground through capacitor 32 and resistor 33. A positive charge will build up on the capacitor 32 creating a positive nulling signal at the inverting terminal of comparator 12, which is a negative nulling signal at the output of comparator 12.

What is claimed is:

1. An automatic d-c offset cancellation circuit for a pulse code modulation (PCM) encoder including a comparator at its output, comprising:

a capacitor for charge storage, coupled to an input of said comparator by means of a unity gain buffer amplifier;

first and second transistors for charging said capacitor, said first transistor an NPN transistor responding to a first control signal to charge said capacitor negatively; said second transistor a PNP transistor responding to a second control signal to charge said capacitor positively;

first and second flip-flops and first and second OR gates for controlling said first and second transistors, said first flip-flop responsive to the output signal of said comparator; said second flip-flop responsive to an enable signal; said first OR gate responsive to the standard output signal of each flip-flop, said second OR gate responsive to the complementary output signal of said first flip-flop and the output signal of said second flip-flop; the output signals of said OR gates being said control signals for said first and second transistors.

* * * * *